(12) United States Patent
Nelson et al.

(10) Patent No.: US 9,612,998 B2
(45) Date of Patent: Apr. 4, 2017

(54) METHOD AND APPARATUS FOR MOTOR DRIVE DIAGNOSTICS

(71) Applicant: Rockwell Automation Technologies, Inc., Mayfield, OH (US)

(72) Inventors: Mark V. Nelson, Racine, WI (US); Craig R. Winterhalter, Cedarburg, WI (US); Jeffrey J. Pankau, Jackson, WI (US); Patrick E. Ozimek, Wauwatosa, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 1067 days.

(21) Appl. No.: 13/677,371

(22) Filed: Nov. 15, 2012

(65) Prior Publication Data

US 2014/0136130 A1     May 15, 2014

(51) Int. Cl.
*G01R 31/40* (2014.01)
*G06F 17/00* (2006.01)
*H02M 1/32* (2007.01)
*H02P 29/024* (2016.01)

(52) U.S. Cl.
CPC ............ *G06F 17/00* (2013.01); *G01R 31/40* (2013.01); *H02M 1/32* (2013.01); *H02P 29/0241* (2016.02)

(58) Field of Classification Search
CPC ......... G06F 17/00; G01R 31/40; G01R 31/42; G01R 31/025; G01R 31/24; H02P 29/0241; H02P 29/024
See application file for complete search history.

(56) References Cited

U.S. PATENT DOCUMENTS

| 2009/0080127 A1* | 3/2009 | Mirafzal | H02H 3/16 361/42 |
| 2010/0259099 A1* | 10/2010 | Vedula | H02P 29/00 307/9.1 |
| 2012/0217920 A1* | 8/2012 | Singh | G01R 31/42 318/490 |

* cited by examiner

*Primary Examiner* — Manuel L Barbee
(74) *Attorney, Agent, or Firm* — Boyle Fredrickson, SC

(57) ABSTRACT

A method for detecting fault conditions in a motor drive at power up is disclosed. During the power up sequence, input power is applied to the motor drive and the DC bus begins to charge to its normal operating level. Once the DC bus has reached a suitable level and prior to commanding motion of the attached motor, the shunt resistor is connected across the DC bus for a short duration. The amplitude of voltage and current present on the DC bus are measured while the shunt resistor is connected across the DC bus. The measurements are then used to detect fault conditions in the motor drive. The presence of the fault conditions are relayed to an operator. Thus, the motor drive may detect certain fault conditions prior to commanding motion from the drive.

18 Claims, 2 Drawing Sheets

METHOD AND APPARATUS FOR MOTOR DRIVE DIAGNOSTICS

BACKGROUND OF THE INVENTION

The subject matter disclosed herein relates generally to detecting fault conditions in a motor drive and, more specifically, to utilizing an existing shunt resistor connected to a motor drive to detect the fault conditions.

As is known to those skilled in the art, motor drives are commonly connected between a power source and a motor to control operation of the motor. The input power source may be direct current (DC) or alternating current (AC) and, if the input power source is AC, it may be single-phase or multi-phase and commonly is three-phase. Similarly, the motor may be a DC or AC motor of various types. Consequently, the motor drive is selected according to the power source and type of motor required by a given application. The input of each motor drive is connected to the power source and the output connected to the motor.

A motor drive may be mounted in an enclosure for protection from the elements in an outside application, protection from the operating environment in certain indoor applications, or simply for ease of manufacturing. During assembly of the enclosure, the motor drive may be mounted to a panel at a first station and installed and wired in the enclosure at a second station. Field installation and connection to the input power is performed at a remote location. Because of the numerous configurations of motor drives and the often modular nature of installation, the potential exists for wiring and/or configuration errors when installing, commissioning, or servicing motor drives.

Although motor drives often include sensors and/or detection circuits in an attempt to detect fault conditions, historically, detection does not occur until a run command is issued. Once a run command is issued, sensors detect operating conditions within the motor drive and provide signals corresponding to the voltage and/or current at various points within the drive to a processor and/or logic circuit configured to detect specific fault conditions.

However, some of the fault conditions may be the result, for example, of improper wiring or configuration of the drive. Still other fault conditions may arise if, for example, a fuse or circuit breaker failed between the input power source and the motor drive. Such fault conditions exist prior to attempting to issue a run command. A run command is typically issued when an operator and/or controller desires certain performance from the motor. Further, the motor drive may be part of a system, and other components of the system may already be operating and/or waiting upon execution of the run command by the motor drive. Thus, waiting until the run command is issued to detect these fault conditions may cause unnecessary and undesirable delays in operation.

BRIEF DESCRIPTION OF THE INVENTION

The subject matter disclosed herein describes a method for detecting fault conditions in a motor drive at power up. During the power up sequence, input power is applied to the motor drive and the DC bus begins to charge to its normal operating level. Once the DC bus has reached a suitable level and prior to commanding motion of the attached motor, the shunt resistor, which is typically provided to discharge regenerative energy from the DC bus, is connected across the DC bus for a short duration. The amplitude of voltage and current present on the DC bus are measured while the shunt resistor is connected across the DC bus. The measurements are then used to detect fault conditions in the motor drive. The presence of the fault conditions are relayed to an operator, for example, via a visual or audio indication or via a message communicated to another controller. Thus, the motor drive may detect certain fault conditions prior to sending a run command to the drive.

According to one embodiment of the invention, a method of detecting a fault condition in a power converter configured to transfer power between a DC bus and a motor is disclosed. The power converter has a shunt resistor selectively connected across the DC bus. The method includes the steps of measuring an amplitude of voltage present on the DC bus when there is no power transfer between the DC bus and the motor, verifying that the amplitude is greater than a first threshold, connecting the shunt resistor across the DC bus when the amplitude is greater than the first threshold and when there is no power transfer between the DC bus and the motor, measuring the amplitude of voltage present on the DC bus when the shunt resistor is connected across the DC bus, measuring an amplitude of current present on the DC bus when the shunt resistor is connected across the DC bus, and detecting at least one fault condition as a function of the amplitude of at least one of the voltage and the current present on the DC bus when the shunt resistor is connected across the DC bus.

According to another embodiment of the invention, a method of detecting a fault condition in a power converter having a DC bus is disclosed. The power converter is configured to transfer power between an input power source and a motor. The method includes the steps of measuring an amplitude of voltage present on the DC bus when there is no power transfer between the DC bus and the motor, verifying that the amplitude of voltage is greater than a first threshold, connecting an electrical load across the DC bus when the amplitude of voltage is greater than the first threshold and when there is no power transfer between the DC bus and the motor, measuring the amplitude of voltage present on the DC bus when the electrical load is connected across the DC bus, and detecting at least one fault condition as a function of the amplitude of voltage present on the DC bus when the electrical load is connected across the DC bus.

According to yet another embodiment of the invention, a diagnostic system for a motor drive having a DC bus includes a resistor configured to be connected across the DC bus, a switching device operatively connected in series with the resistor to selectively connect the resistor across the DC bus, a voltage sensor generating a signal corresponding to an amplitude of voltage present on the DC bus, a memory device configured to store a plurality of instructions, and a processor. The processor is configured to execute the plurality of instructions, receive the signal from the voltage sensor corresponding to an amplitude of voltage present on the DC bus, and generate a signal to control the switching device. At power up the processor is further configured to measure an amplitude of voltage present on the DC bus when there is no power transfer between the DC bus and a motor connected to the motor drive, verify that the amplitude is greater than a first threshold, connect the resistor across the DC bus when the amplitude is greater than the first threshold and when there is no power transfer between the DC bus and the motor, measure the amplitude of voltage present on the DC bus when the shunt resistor is connected across the DC bus, and detect at least one fault condition as a function of the amplitude of the voltage present on the DC bus when the shunt resistor is connected across the DC bus.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

Figure 1:
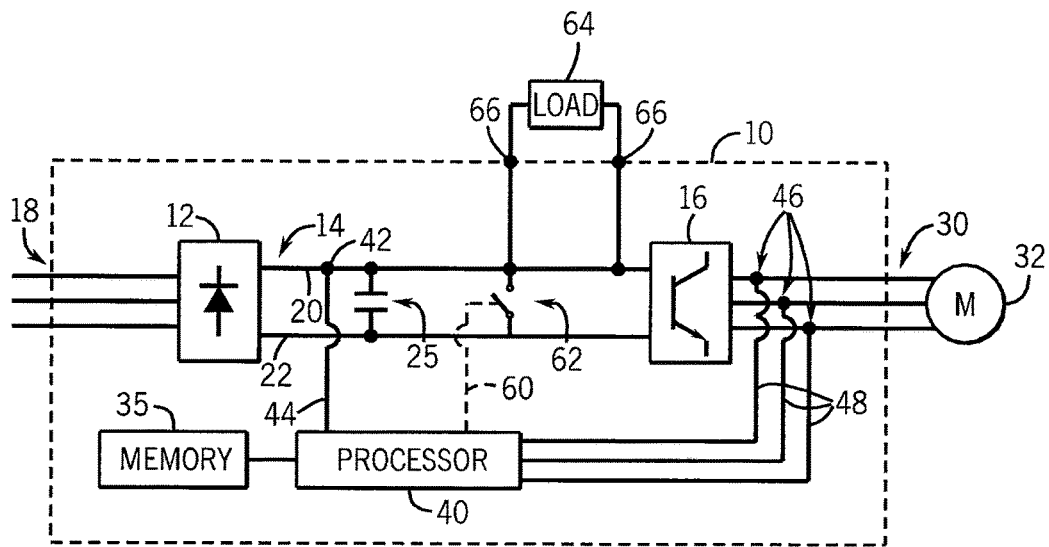
FIG. 1 is a schematic representation of a motor drive according to one embodiment of the invention.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION OF THE PREFERRED EMBODIMENTS

Turning initially to FIG. 1, a common topology for a motor drive 10 is illustrated. The motor drive 10 includes a rectifier section 12, a DC bus section 14, and an inverter section 16. The motor drive 10 receives three-phase AC input voltage 18 into the rectifier section 12. The rectifier section 12 may include passive or active rectification, for example diodes, thyristors, silicon controlled rectifiers, or transistors as is known in the art, to convert the three-phase AC input voltages into DC voltages. These DC voltages are present on the positive and negative DC bus rails 20 and 22 of the DC bus section 14. Typical DC voltages may be a positive or negative 650 volts for a common 460 volt, three-phase AC input voltage. To maintain a stiff DC voltage on each of the positive and negative bus rails, 20 and 22, a DC bus capacitor 25 is included between the rails 20 and 22. A stiff DC voltage remains approximately equal to the peak value of the AC input voltage 18 despite transient voltages and currents present on the DC bus, for example, when there is a change in the load on the output of the motor drive 10. The DC bus capacitor 25 may alternately consist of one or more capacitors connected in series, parallel, or any combination thereof, as is known in the art. The DC bus section 14 is then connected to the inverter section 16. The inverter section 16 consists of switching elements, such as transistors or thyristors as is known in the art. The inverter section 16 converts the DC voltages from the positive and negative rails 20 and 22 into a controlled three phase output voltage 30 to the motor 32.

One or more modules are used to control operation of the motor drive 10. The modules may be stored programs executed on a processor, logic circuits, or a combination thereof. The motor drive 10 includes a non-transitory storage device, or memory 35, configured to store data and programs, which include a series of instructions executable by the processor 40. It is contemplated that the memory 35 may be a single device, multiple devices, or incorporated, for example, as a portion of another device such as an application specific integrated circuit (ASIC). The processor 40 is in communication with the memory 35 to read the instructions and data as required to control operation of the motor drive 10. According to one embodiment of the invention, the processor 40 receives a reference signal identifying desired operation of the motor 32 connected to the motor drive 10. The reference signal may be, for example, a speed reference or a torque reference. The processor 40 similarly receives feedback signals 44, 48 from sensors 42, 46 indicating the present operation of the motor drive 10. The feedback signals 44, 48 may include, but are not limited to, the magnitude of voltage and/or current present on the DC bus 14 or at the output 30 of the motor drive 10. The processor 40 executes a control module responsive to the reference signal and the feedback signals 44, 48 providing, for example, voltage and/or current signals corresponding to one or more phases of the desired output voltage to be provided to the motor 32.

Figure 2:
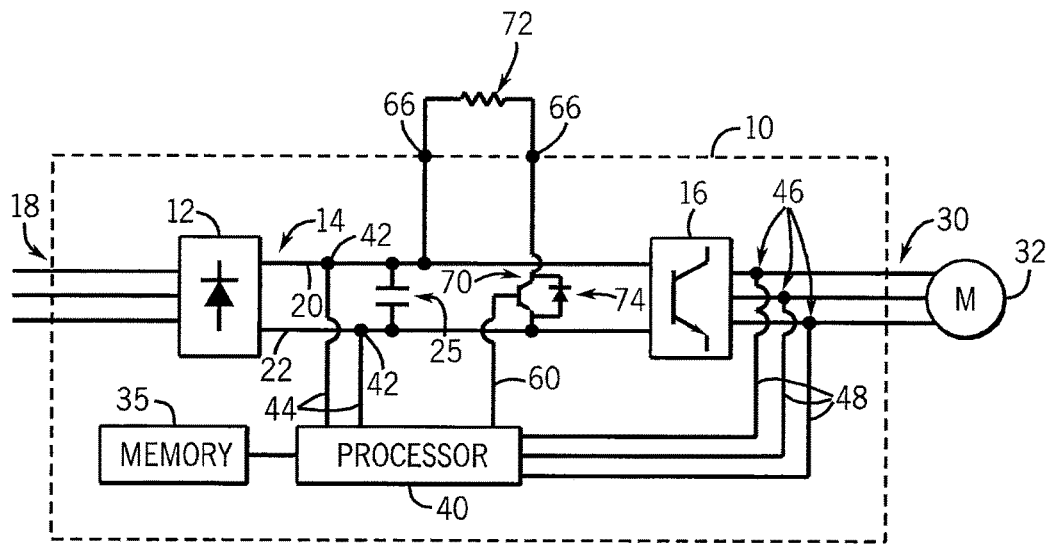
FIG. 2 is a schematic representation of a motor drive according to another embodiment of the invention.

A shunt device 64 is connected to each motor drive 10 to dissipate excess power from the DC bus 14. Terminals 66 are configured to provide an electrical connection between the motor drive 10 and the shunt device 64. A switch 62 selectively connects either the negative rail 22 or the positive rail 20 to one of the terminals 66. The other of the negative rail 22 or the positive rail 20 is connected to the other terminal 66. Closing the switch 62 electrically connects the shunt device 64 across the DC bus 14 while opening the switch 62 disconnects the shunt device 64 from the DC bus 14. Referring also to FIG. 2, the switch 62 may be a transistor 70, for example, an insulated gate bipolar transistor (IGBT) with a diode 74 connected in parallel to the transistor 70. The shunt device 64 may be a resistor 72 and, more specifically, a power resistor, configured to dissipate power across the resistor 72 as heat. A shunt control module in the processor 40 receives a feedback signal 44 corresponding to the magnitude of the voltage present on the DC bus 14 and generates a control signal 60 to selectively open and close the switch 62.

Figure 3:
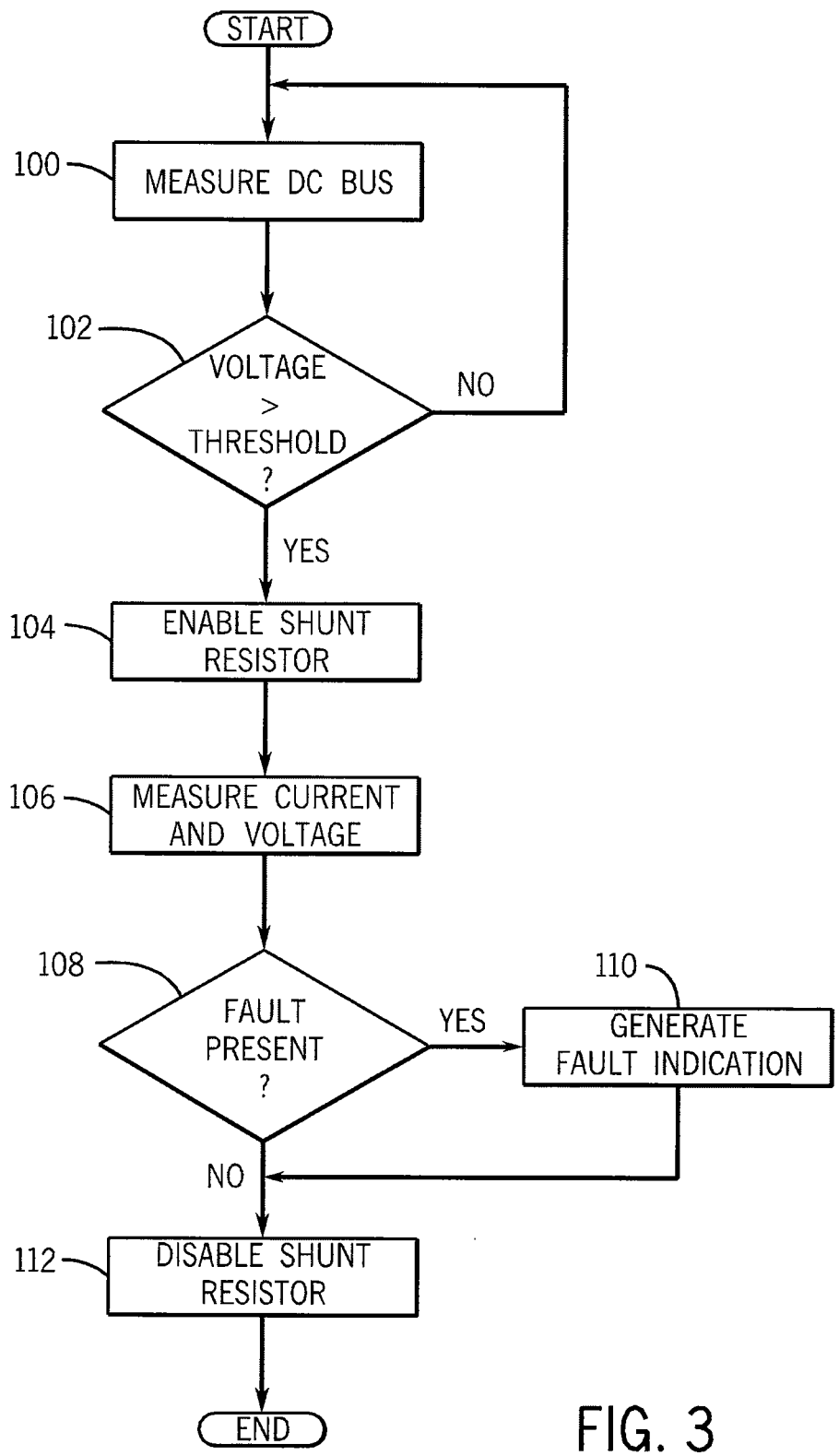
FIG. 3 is a flowchart representing the steps taken to detect fault conditions in the motor drive of FIG. 1 according to one embodiment of the invention.

In operation, the processor 40 in the motor drive 10 executes a fault detection module to detect fault conditions that are present at power up. Referring next to FIG. 3, the fault detection module measures the voltage present on the DC bus, as shown in step 100. At step 102, the fault detection module compares the measured voltage to a predefined threshold. If the measured voltage is less than the threshold, execution of the fault detection module returns to measuring the voltage present on the DC bus. When the measured voltage exceeds the threshold, the fault detection module generates the control signal 60 to close the switch 62, connecting the shunt device 64 across the DC bus 14, as shown in step 104. At step 106, the fault detection module measures the voltage and current on the DC bus 14. At step 108, the fault detection module determines whether a fault is present. As will be discussed in more detail below, the fault detection module may use the amplitude of the voltage and current measured on the DC bus 14 to determine whether one of a number of faults is present. If a fault is present, the fault detection module generates an indication of the fault, as shown at step 110. The indication may be a signal output to energize a visual or audible indicator.

Optionally, the indication may be a message that is displayed on an operator connected to the motor drive 10 or that is transmitted to a remote controller for display on another monitor. At step 112, the fault detection module generates the control signal 60 to open the switch 62, disconnecting the shunt device 64 from the DC bus 14. The steps shown in FIG. 3 need not be executed entirely in the order shown and may be executed in different order without deviating from the scope of the invention. For example, the voltage and current measured on the DC bus may be stored in the memory device 35 and the control signal 60 to open the switch 62 generated prior to determining whether a fault is present. The determination of whether a fault is present may subsequently be made on the values of voltage and current stored in the memory device 35.

According to another aspect of the invention, the fault detection module executes as part of the start-up routine of the motor drive 10. By executing the fault detection module during the start-up routine, no power is being transferred from the motor drive 10 to the motor 32. Thus, the only electrical load placed on the DC bus 14 during execution of the fault detection module is the shunt device 64. In addition, connecting a resistor 72 across the DC bus 14 allows Ohm's law, shown in Eq. 1, to define a proportional relationship between voltage and current as a function of the resistance value of the resistor 72. Optionally, a separate switching device and resistor combination, which is dedicated for use by the fault detection module, may be either included in the drive or supplied external to the drive. As still another option, a reactive element, such as a capacitor and/or inductor, may be used in cooperation with the resistor as an electrical load across the DC bus 14 to provide a well-defined transient response when the electrical load is connected across the DC bus 14. By using the shunt resistor 72 and its associated transistor 70 included in the motor drive 10, no additional hardware components are required.

$$V = I \times R \quad (1)$$

According to another aspect of the invention, the fault detection module generates the control signal 60 used to control the switch 62, connecting the shunt device 64 across the DC bus 14. The fault detection module first verifies that no power is being transferred from the DC bus 14 to the motor 32. According to one embodiment of the invention, verification is done as a function of the sequence in which modules are executed at power up. The motor drive 10 may execute the fault detection module prior to executing a control module or a switching module that would need to be executing in order to effect power transfer between the DC bus 14 and the motor 32. Optionally, the fault detection module may monitor the current and/or voltage feedback signals 48 at the output of the motor drive 10 to verify that there is no power transfer occurring. Once the DC bus 14 has reached a predefined threshold value, indicating an initial state of charge on the DC bus 14, the fault detection module generates the control signal 60 to close switch 62 and connect the shunt device 64 across the DC bus 14. It is further contemplated, that the fault detection module may modulate the control signal 60 such that the shunt device 64 is not continually connected across the DC bus 14. Modulation of the control signal 60 alternately connects and disconnects the shunt device 64 across the DC bus 14, resulting in an average power dissipated across the shunt device 64 as a function of the modulation routine. The duration of modulation and/or continuous connection of the shunt device 64 across the DC bus 14 is kept short to prevent excessive power loss across the shunt device 64 during the power up sequence. According to one embodiment of the invention, the duration is less than about 200 milliseconds and, preferably, is about 50 milliseconds.

The magnitude of voltage and current measured on the DC bus 14 during the period in which the shunt device 64 is connected may be used to detect one of a number of faults present on the motor drive. A short circuit across the shunt device 64 is detected if, when the switch 62 is commanded to close, the current on the DC bus 14 increases significantly. If the switch 62 is the shunt transistor 70, an over current detection circuit is typically included on the power block housing the transistor 70. The detection of an over current condition on the transistor 70 when the switch 62 is commanded to close similarly indicates a short circuit across the shunt device 64. Also, when the switch 62 is commanded to close, the voltage on the DC bus 14 must remain above a preset threshold. If the voltage drops below the threshold, this indicates that the input power was lost and unable to maintain the voltage level on the DC bus 14.

If neither the over current condition on the switch 62 nor the low voltage level on the DC bus 14 is detected when the switch 62 is commanded to close, the magnitude of current on the DC bus 14 is evaluated to determine whether it is within an expected range. A failure in the shunt device 64 or in the electrical connections between the shunt device 64 and the DC bus 14 may be indicated if, when the switch 62 is commanded to close, the magnitude of the current on the DC bus 14 is zero. A failure in the shunt device 64 or in the electrical connections between the shunt device 64 and the DC bus 14 may also be indicated if, when the switch 62 is commanded to close, the magnitude of the voltage on the DC bus 14 remains the same. If the magnitude of the current on the DC bus 14 is non zero but either higher than or lower than the expected range, the value of the shunt resistor 72 may be different than the expected value for the motor drive 10.

The motor drive 10 may also be configured to determine the frequency of the harmonic components present on the DC bus 14. A sensor 42 may provided to measure either the voltage or the current on the DC bus 14. Optionally, a pair of sensors 42 is provided to measure both the voltage and current on the DC bus 14. The feedback signal 44 from the sensor 42 is provided to the controller. According to one embodiment of the invention, the fault detection module may be configured to execute a fast Fourier transform (FFT) routine on the measured voltage and/or current. The FFT generates the amplitude of the harmonic content of the measured signal. If the amplitudes of the harmonic content correspond to a predefined set of amplitudes, then no fault is detected. If, however, the amplitudes of the harmonic content are outside the expected set of amplitudes, a phase loss fault is detected. A phase loss occurs when one of the input phases on the multiphase power input is not present.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention

We claim:

1. A method of detecting a fault condition in a power converter having a DC bus, wherein the power converter is configured to transfer power between the DC bus and a motor and wherein the power converter has a shunt resistor selectively connected across the DC bus, the method comprising the steps of:
measuring an amplitude of voltage present on the DC bus when there is no power transfer between the DC bus and the motor;
verifying that the amplitude of voltage is greater than a first threshold;
connecting the shunt resistor across the DC bus when the amplitude of voltage is greater than the first threshold and when there is no power transfer between the DC bus and the motor;
measuring the amplitude of voltage present on the DC bus when the shunt resistor is connected across the DC bus;
measuring an amplitude of current present on the DC bus when the shunt resistor is connected across the DC bus; and
detecting at least one fault condition as a function of the amplitude of at least one of voltage and current present on the DC bus when the shunt resistor is connected across the DC bus.

2. The method of claim 1 wherein a first fault condition is detected when the amplitude of current present on the DC bus when the shunt resistor is connected across the DC bus remains substantially the same as the amplitude of current present on the DC bus prior to the shunt resistor being connected across the DC bus.

3. The method of claim 1 wherein a second fault condition is detected when the amplitude of voltage present on the DC bus drops below a second threshold when the shunt resistor is connected across the DC bus.

4. The method of claim 1 wherein a third fault condition is detected when the amplitude of current present on the DC bus is less than an expected range when the shunt resistor is connected across the DC bus.

5. The method of claim 4 wherein a fourth fault condition is detected when the amplitude of current present on the DC bus is greater than the expected range when the shunt resistor is connected across the DC bus.

6. The method of claim 1 further comprising the step of determining at least one harmonic component of the measured voltage, wherein a fifth fault condition is detected when the frequency of the harmonic components is outside a predefined range.

7. The method of claim 1 further comprising the step of determining at least one harmonic component of the measured current, wherein a sixth fault condition is detected when the frequency of the harmonic components is outside a predefined range.

8. A method of detecting a fault condition in a power converter having a DC bus, the power converter configured to transfer power between an input power source and a motor, the method comprising the steps of:
measuring an amplitude of voltage present on the DC bus when there is no power transfer between the DC bus and the motor;
verifying that the amplitude of voltage is greater than a first threshold;
connecting a shunt resistor used to dissipate regenerative energy from the motor across the DC bus when the amplitude of voltage is greater than the first threshold and when there is no power transfer between the DC bus and the motor;
measuring the amplitude of voltage present on the DC bus when the shunt resistor is connected across the DC bus; and
detecting at least one fault condition as a function of the amplitude of voltage present on the DC bus when the shunt resistor is connected across the DC bus.

9. The method of claim 8 further comprising the steps of:
measuring an amplitude of current present on the DC bus when the shunt resistor is connected across the DC bus; and
detecting at least one fault condition as a function of the amplitude of at least one of voltage and current present on the DC bus when the shunt resistor is connected across the DC bus.

10. The method of claim 8 wherein the power converter includes a braking transistor configured to connect the shunt resistor to the DC bus and wherein the power converter controls the braking transistor to selectively connect the shunt resistor across the DC bus when the amplitude of voltage is greater than the first threshold and when there is no power transfer between the DC bus and the motor.

11. The method of claim 8 wherein a test resistor is connected across the DC bus of the power converter, the amplitude of voltage present across the test resistor is measured when the test resistor is connected across the DC bus, and the fault condition is detected as a function of the voltage present across the test resistor when the test resistor is connected across the DC bus.

12. The method of claim 11 wherein at least one reactive component is connected across the DC bus along with the test resistor.

13. A diagnostic system for a motor drive having a DC bus, the diagnostic system comprising:
a resistor configured to be connected across the DC bus;
a switching device operatively connected in series with the resistor to selectively connect the resistor across the DC bus;
a voltage sensor generating a signal corresponding to an amplitude of voltage present on the DC bus;
a memory device configured to store a plurality of instructions;
a processor configured to execute the plurality of instructions, receive the signal from the voltage sensor corresponding to an amplitude of voltage present on the DC bus, and generate a signal to control the switching device, wherein at power up the processor is configured to:
measure an amplitude of voltage present on the DC bus when there is no power transfer between the DC bus and a motor connected to the motor drive;
verify that the amplitude is greater than a first threshold;
connect the resistor across the DC bus when the amplitude is greater than the first threshold and when there is no power transfer between the DC bus and the motor;
measure the amplitude of voltage present on the DC bus when the shunt resistor is connected across the DC bus; and
detect at least one fault condition as a function of the amplitude of the voltage present on the DC bus when the shunt resistor is connected across the DC bus.

14. The diagnostic system of claim 13 further comprising a current sensor generating a signal corresponding to an amplitude of current present on the DC bus, wherein the processor is further configured to:
measure an amplitude of current present on the DC bus when the resistor is connected across the DC bus; and detect at least one fault condition as a function of the amplitude of at least one of the voltage and the current present on the DC bus when the resistor is connected across the DC bus.

15. The diagnostic system of claim 14 wherein the resistor is a shunt resistor used to dissipate regenerative energy from the motor.

16. The diagnostic system of claim 14 wherein the resistor is a test resistor mounted internal to the motor drive.

17. The diagnostic system of claim 14 wherein the amplitude of voltage and the amplitude of current are sampled in tandem and the processor is further configured to detect a phase shift between the measured voltage and the measured current.

18. The diagnostic system of claim 14 wherein the processor is further configured to:
   determine at least one harmonic component of one of the measured voltage and the measured current, and
   detect a fault condition when the frequency of the harmonic components is outside a predefined range.

* * * * *